United States Patent
Kfir

(10) Patent No.: US 9,946,624 B1
(45) Date of Patent: Apr. 17, 2018

(54) SYSTEMS AND METHODS TO CAPTURE DATA SIGNALS FROM A DYNAMIC CIRCUIT

(71) Applicant: CADENCE DESIGN SYSTEMS, INC., San Jose, CA (US)

(72) Inventor: Alon Kfir, San Jose, CA (US)

(73) Assignee: Cadence Design Systems, Inc., San Francisco, CA (US)

( * ) Notice: Subject to any disclaimer, the term of this patent is extended or adjusted under 35 U.S.C. 154(b) by 97 days.

(21) Appl. No.: 14/960,036

(22) Filed: Dec. 4, 2015

(51) Int. Cl.
  *G06F 11/00* (2006.01)
  *G06F 11/34* (2006.01)
  *G06F 11/30* (2006.01)

(52) U.S. Cl.
  CPC ........ *G06F 11/348* (2013.01); *G06F 11/3041* (2013.01)

(58) Field of Classification Search
  CPC .................................................. G06F 11/348
  See application file for complete search history.

(56) References Cited

U.S. PATENT DOCUMENTS

| | | | | |
|---|---|---|---|---|
| 7,379,861 B2* | 5/2008 | Kfir | ...................... | G06F 17/5027 703/15 |
| 9,286,424 B1* | 3/2016 | Larzul | ................. | G06F 17/5027 |
| 2003/0154430 A1* | 8/2003 | Allen | .................... | G06F 11/364 714/45 |
| 2004/0216061 A1* | 10/2004 | Floyd | ................. | G01R 31/3177 716/136 |
| 2010/0332909 A1* | 12/2010 | Larson | ................ | G06F 11/3476 714/40 |
| 2015/0278064 A1* | 10/2015 | Cohen | ................. | G06F 11/3476 714/45 |
| 2016/0062869 A1* | 3/2016 | Bansal | ................ | G06F 11/3476 714/45 |

* cited by examiner

*Primary Examiner* — Christopher McCarthy
(74) *Attorney, Agent, or Firm* — Eric L. Sophir; Dentons US LLP

(57) ABSTRACT

A system for tracing an operation of an electronic circuit is provided. The system includes an electronic circuit, a trace buffer, and a trigger detection circuit. The trace buffer includes a plurality of segments configured to continually collect and store data signals of the electronic circuit. The data signals are collected in a current segment of the plurality of segments. The trigger detection circuit is adapted to provide a trigger signal when a trigger condition is met. Each time upon generation of the trigger signal when the trigger condition is met, the collection of the data signals is stopped in the current segment and subsequent data signals are collected in a new segment of the plurality of segments.

13 Claims, 8 Drawing Sheets

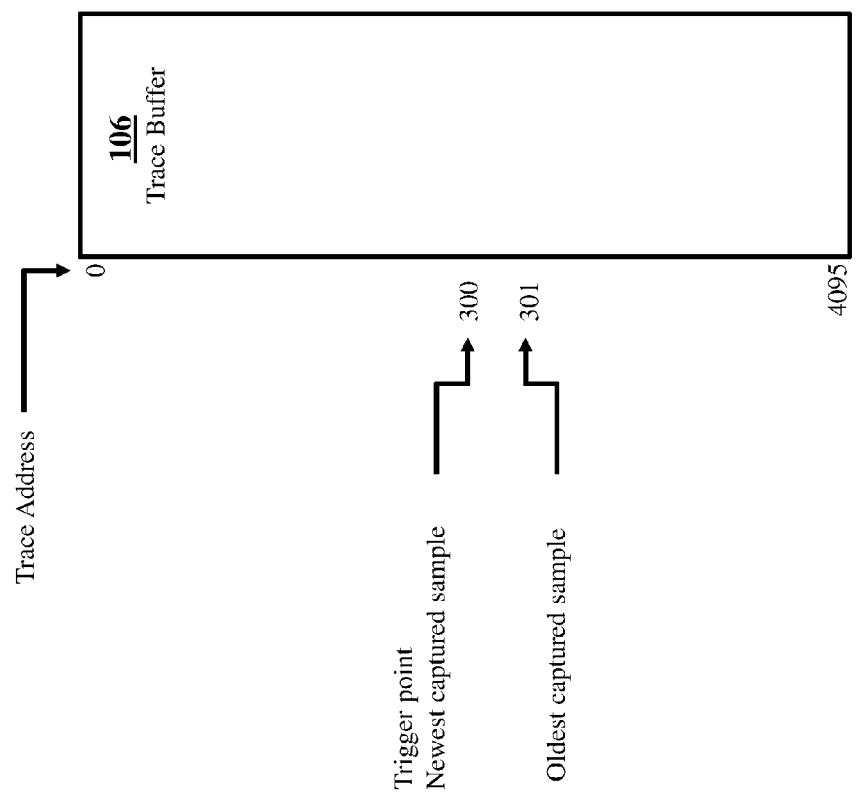

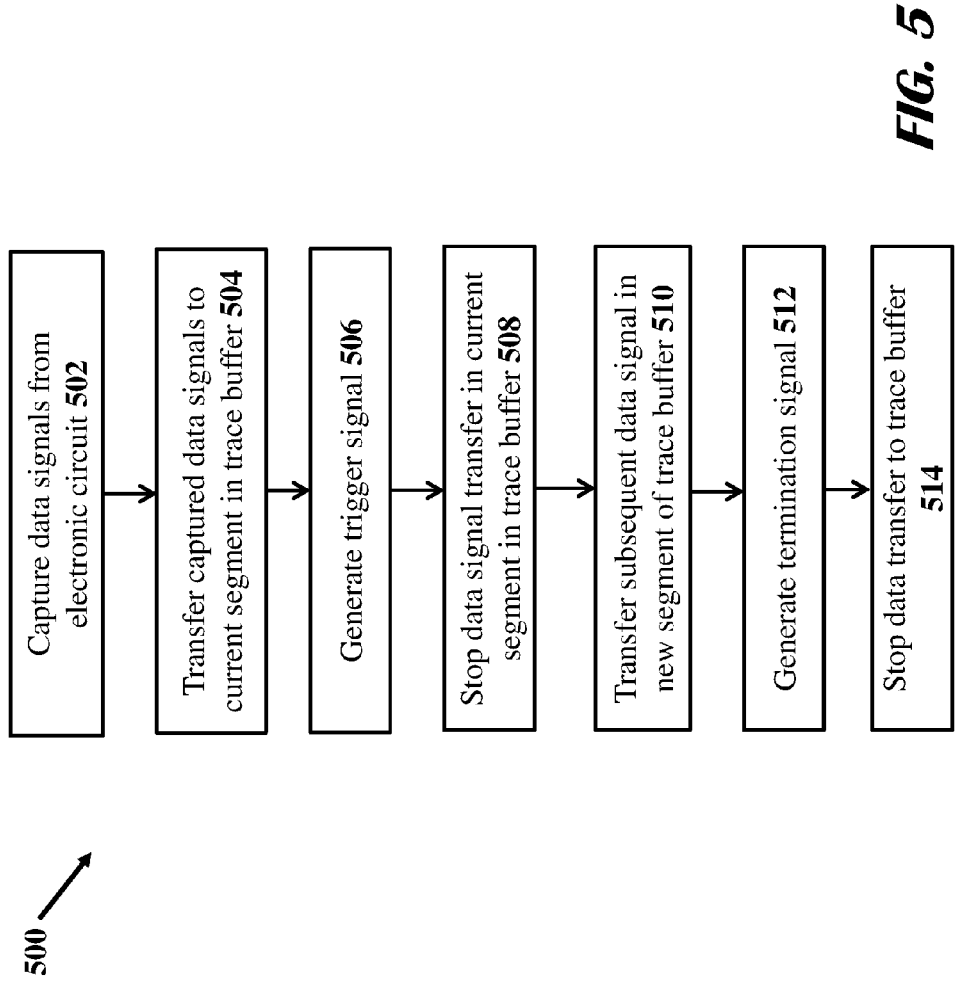

SYSTEMS AND METHODS TO CAPTURE DATA SIGNALS FROM A DYNAMIC CIRCUIT

TECHNICAL FIELD

This application relates generally to logic analyzers and, more specifically, relates to methods and systems for capturing of data signals from a dynamic circuit by a logic analyzer.

BACKGROUND

The design of digital electronic circuits requires verification of the design before fabrication, and also ability to troubleshoot or characterize a hardware electronic circuit after manufacturing. In both cases, a Logic Analyzer is an essential tool, from a semiconductor chip level all the way to a board and system level. Emulation systems are one type of a verification system that can be used to verify the electronic circuit design before fabrication, and a logic analyzer is typically integrated into high end emulation systems. After fabrication, a stand-alone logic analyzer, or a digital oscilloscope can be used to troubleshoot design or manufacturing problems at the board or system level. The boundaries between advanced digital oscilloscopes and logic analyzers have become blurred, but they are all based on the same underlying principle of capturing multiple samples of signal values along the time axis and presenting them later to the user after some processing. The data is displayed as either waveforms or in textual format. The captured data can also be processed by other software tools, typically running on an external workstation, for various purposes such as power analysis, bus protocol compliance, etc.

One type of verification system for a Device Under Test (DUT) is a hardware emulation system that aims to increase verification productivity, speed up time-to-market, and deliver greater confidence in the final system on chip product. A hardware emulation system is in communication with a workstation. The DUT is the term given to the part of the design that is being emulated by the emulation system.

A conventional logic analyzer is usually integrated into the hardware emulation system. The logic analyzer is an electronic instrument that is used to capture and display data signals of the DUT that carry digital information. Generally, the logic analyzer captures the data signals that are too fast to be observed by a circuit designer. The circuit designer observes the data signals captured by the logic analyzer to effectively analyze the DUT and use the analysis to take preemptive actions or debug. As a result, the logic analyzer can provide visibility of the DUT undergoing emulation.

The logic analyzer includes a trace buffer, which is in communication with the signals in the DUT. The trace buffer stores the captured data signals from the elements of the DUT undergoing emulation. Control circuitry communicates with the signals in the DUT and generates logic analyzer clock signals that clock the data into the trace buffer. The control circuitry also generates trigger signals when predetermined sequences of signal values, as defined by the circuit designer, occur in the DUT.

The conventional logic analyzer integrated in the hardware emulation system can be programmable to capture and store the data signals in the trace buffer as specified by the circuit designer. The data signals can include a preset amount of data samples having values of the DUT signals that occur before a defined trigger point. The trigger point is typically defined as a condition based on signal values in the DUT or a sequence of such conditions. In other words, the conventional logic analyzer is programmable to capture the data history preceding the trigger point to the trace buffer. The data signals stored by the logic analyzer may then be transferred to a computer for further analysis.

FIG. 1A illustrates a block diagram of a conventional logic analyzer system of an emulation system 100 in an electronic design automation system for verifying that a logic design conforms to its specification before the logic design is manufactured as integrated circuits (ICs). The logic designs may be described using various languages, such as hardware description languages (HDLs) or other more abstract languages. Functional verification is performed using an emulation process. In the emulation process, the logic design is mapped into a hardware emulator to provide a design under test (DUT) 102.

The logic analyzer system receives a plurality of data signals from the DUT 102. The logic analyzer system is programmable to select a plurality of data signals to be sampled. Selected signals from the DUT 102 are probed and sent to a trigger detection circuit 104 and a trace buffer 106 of the logic analyzer. The data signals received from the DUT 102 are then written into the trace buffer 106 as a circular buffer. In each clock cycle, one data sample of the data signals is written into the trace buffer 106 at a given trace address generated by an address counter 108. After the data sample is written into the given trace address, the address counter 108 advances to point to a next trace address in the trace buffer 106 where the data samples are written. When the address counter 108 reaches a highest available trace address of the trace buffer 106, the address counter 108 continues from a starting point of the trace address, thereby overwriting the old data samples stored in the trace buffer 106.

This process continues until the trigger detection circuit 104 detects a trigger pattern from the captured data signals. The trigger detection circuit 104 is programmable to set a trigger condition and to detect if the captured data signals satisfy the trigger condition. If the trigger condition is satisfied, the trigger detection circuit 104 generates a trigger signal. Upon the generation of the trigger signal, the trigger signal is transmitted to the address counter 108, which causes the address counter 108 to stop counting, and thereby stops capturing the data samples into the trace buffer 106. The data samples stored in the trace buffer 106 may then be transferred to a processing unit 110, which interprets the data samples and displays it on a screen or saves it for further processing.

While transferring the data samples from the trace buffer 106 to the processing unit 110, the logic analyzer cannot continue to capture new data samples in situations when the DUT in the emulation system is connected to a target system whose clock signal cannot be stopped. Otherwise, the logic analyzer may overwrite the data samples in the trace buffer 106 that were already captured, but not yet transferred from the trace buffer 106 to the processing unit 110. Thus, in the conventional logic analyzer of the emulation system 100, the DUT clock signal has to be stopped for the purpose of reading the data samples from the trace buffer 106. The conventional logic analyzer, therefore, cannot capture data history for more than one trigger event when the target system connected to the DUT is a dynamic electronic circuit whose clocks cannot be stopped.

FIG. 1B illustrates a diagram showing the contents of the trace buffer 106 of the conventional logic analyzer system of the emulation system 100. The trace buffer 106 has a total capacity of 4096 addresses. In one example, the data samples obtained from the DUT 102 are written into the trace buffer 106. In each clock cycle, one data sample is written into the trace buffer 106 at a given trace address generated by the address counter 108. The trigger detection circuit 104 detects the trigger pattern from the captured data signals. The trigger detection circuit 104 is further programmable to set the trigger condition and detect if the received data signals satisfy the trigger condition. In the illustrated example, assuming that the trigger condition is satisfied at a trace address 300, then the trigger detection circuit 104 generates the trigger signal. Upon the generation of the trigger signal, the trigger signal is transmitted to the address counter 108 which causes the address counter 108 to stop counting, and thereby stops capturing the data samples into the trace buffer 106. The data samples in the trace buffer 106 are now divided into two blocks, where the oldest captured data samples are stored in trace addresses from 301 to 4095, followed by trace addresses from 0 to 300. Thus, the trace buffer 106 of the conventional logic analyzer of the emulation system 100 is only able to record history of the data signals that occurred before the single trigger point as depicted in FIG. 1C.

The drawback of the above techniques employed by the conventional logic analyzer is that in some cases the conditions for the trigger points may occur several times while running the test, while only one of those trigger points has useful data history that the designer needs. If in such situation it is impossible to determine whether the data history that was captured before the trigger point is useful and that determination can be done only at a later point in time during the test (possibly many million of cycles later), then there is no way to know which trigger point should really stop the clocks for the purpose of reading the data history.

Therefore, there is a need in the art for methods and systems that address the above mentioned drawbacks of the techniques employed by the conventional logic analyzer of the emulation system that can capture data sample history preceding one trigger point only before the logic analyzer needs to stop capturing new data samples in order to transfer the capture data samples to a processing unit for further analysis.

SUMMARY

Methods and systems disclosed herein attempt to address the above issues and may provide a number of other benefits as well. Methods and systems described herein provide a logic analyzer or other instrument that captures data signals into a trace buffer to store the data signal history preceding multiple trigger points when analyzing a dynamic electronic circuit whose clock cannot be stopped. The trace buffer is partitioned into a plurality of segments of either same or different size, where each segment is configured to capture the data signal history for one trigger point and moves from one segment of the trace buffer to a next segment of the trace buffer each time a trigger condition is met.

In one embodiment, a system for tracing operations of electronic circuits, the system comprising: an electronic circuit; a trace buffer comprising a plurality of segments configured to continually collect and store data signals produced by the electronic circuit, wherein the data signals are collected in a first segment of the plurality of segments; and a trigger detection circuit configured to provide a trigger signal to the trace buffer when a trigger condition is met, wherein, upon receiving the trigger signal, the trace buffer collects the data signals from the electronic circuit in a second segment of the plurality of segments, and wherein upon receiving each additional trigger signal, the trace buffer collects the data signals from the electronic circuit in a next segment of the plurality of segments.

In another embodiment, an emulation system comprises a hardware emulator configured to emulate a design under test; a trace buffer of a logic analyzer comprising a plurality of segments configured to continually collect and store data signals of the design under test, wherein the data signals are collected in a current segment of the plurality of segments; and a trigger detection circuit of the logic analyzer adapted to provide a trigger signal when a trigger condition is met, wherein each time upon generation of the trigger signal when the trigger condition is met the collection of the data signals is stopped in the current segment and subsequent data signals are collected in a new segment of the plurality of segments.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

FIG. 1B is a diagram showing the contents of a trace buffer of a conventional logic analyzer system of an emulation system.

FIG. 5 is a flow diagram depicting a method of tracing an operation of a circuit by a logic analyzer system in an emulation system, according to an exemplary embodiment.

DETAILED DESCRIPTION

Figure 1A:
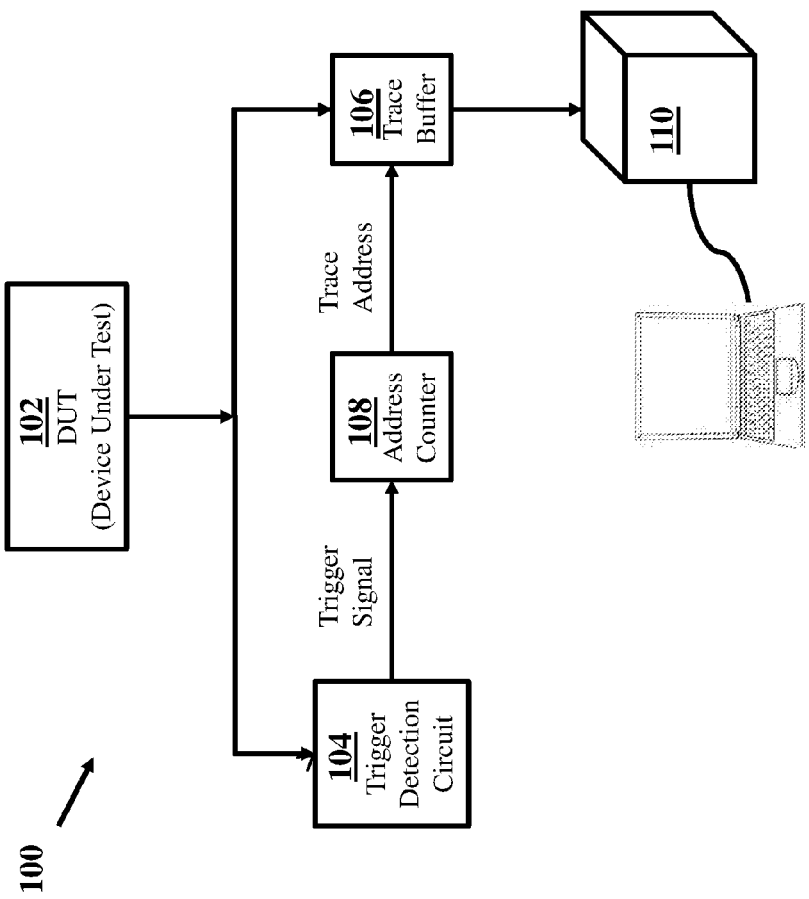
FIG. 1A is a block diagram of a conventional logic analyzer system of an emulation system.
Figure 1C:
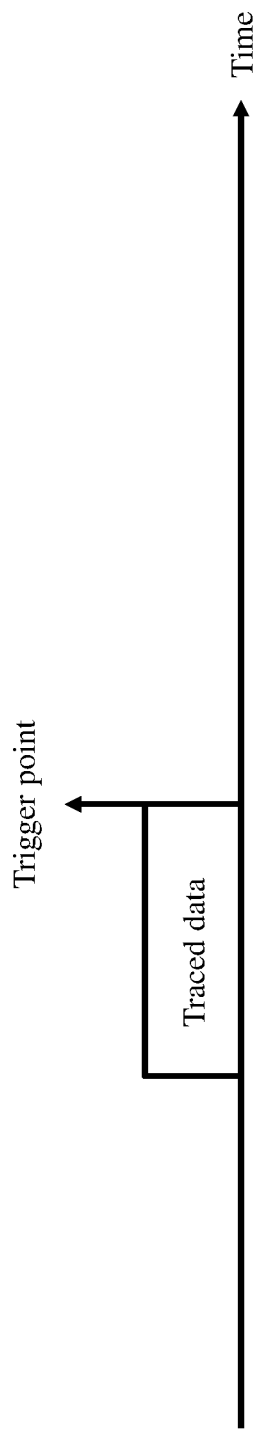
FIG. 1C illustrates a graph depicting that a trace buffer of a conventional logic analyzer system of an emulation system can only record history of data signals that occurred before a single trigger point.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention. The present disclosure is described in detail with reference to embodiments illustrated in the drawings. Other embodiments may be used and/or other changes may be made without departing from the spirit or scope of the present disclosure. The illustrative embodiments described in the Detailed Description are not intended to be limiting upon the subject matter presented herein.

Figure 2:
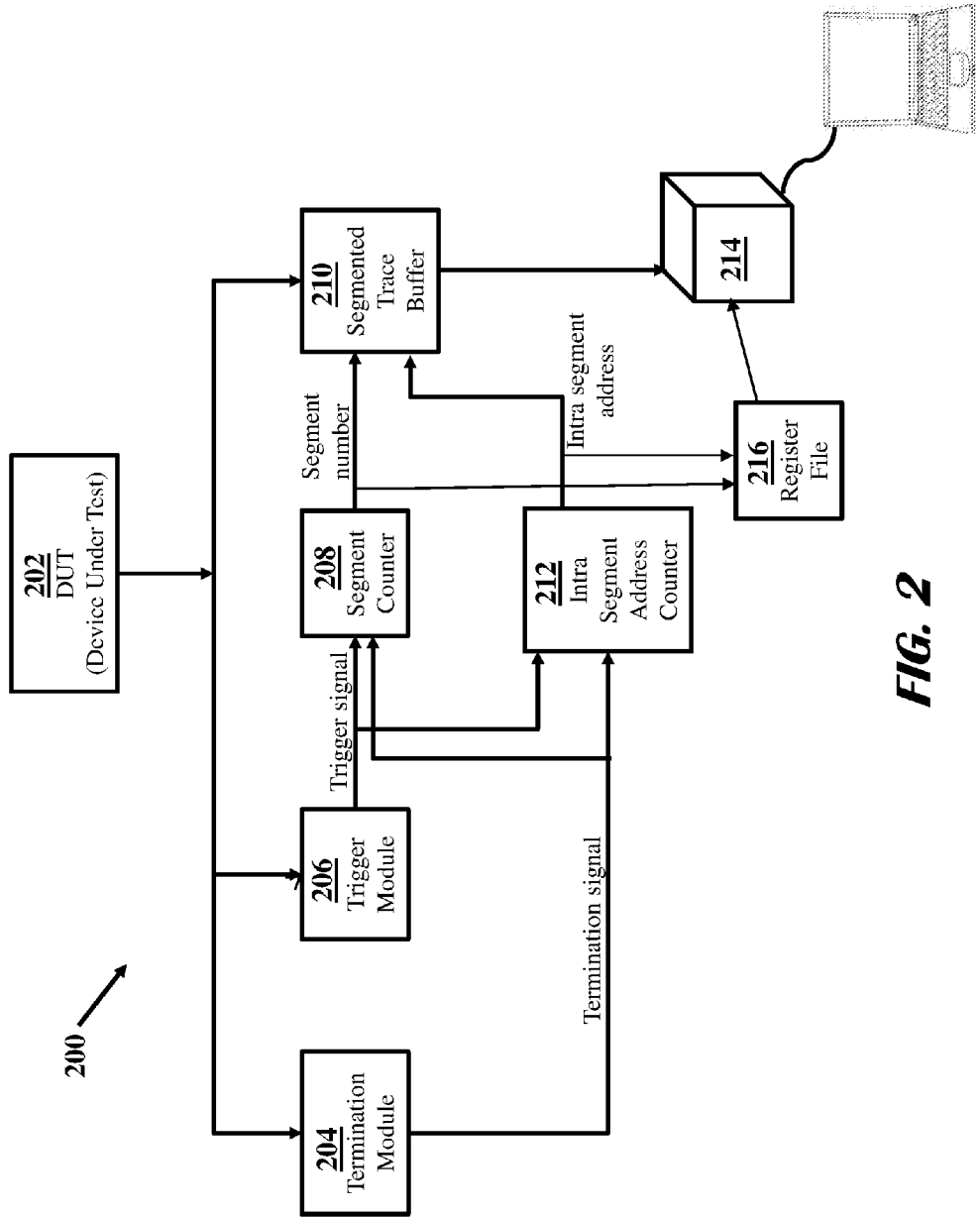
FIG. 2 is a block diagram of a logic analyzer system, according to an exemplary embodiment.

FIG. 2 illustrates a block diagram of a logic analyzer system, according to an exemplary embodiment. The logic analyzer system can capture and display data signals of an electronic circuit. The logic analyzer system may capture the data signals that are too fast to be observed by a circuit designer. The circuit designer observes the data signals captured by the logic analyzer system to effectively analyze the electronic circuit and to take preemptive actions or to debug based on the analysis of the data signals.

The logic analyzer system may be classified as external logic analyzers and embedded logic analyzers. The external logic analyzer may be employed as stand-alone instruments in a number of products and services used for testing complex digital or logic circuits. The embedded logic analyzer may be included within a programmable logic device or an integrated circuit (IC), e.g., a field programmable gate array (FPGA), application specific integrated circuit (ASIC), etc. The embedded logic analyzer has the ability to capture large amounts of high speed data signals within the IC. In alternate embodiment, the logic analyzer may be embedded into a hardware emulator of an emulation system. The embedded logic analyzer may include a trace buffer to store the captured data signals from the IC. The embedded logic analyzer is programmable to capture the data signals from the IC and store the data signals in the trace buffer. The data signals stored by the embedded logic analyzer in the trace buffer may be transferred to a processing unit of an external computing device for further analysis.

Figure 3:
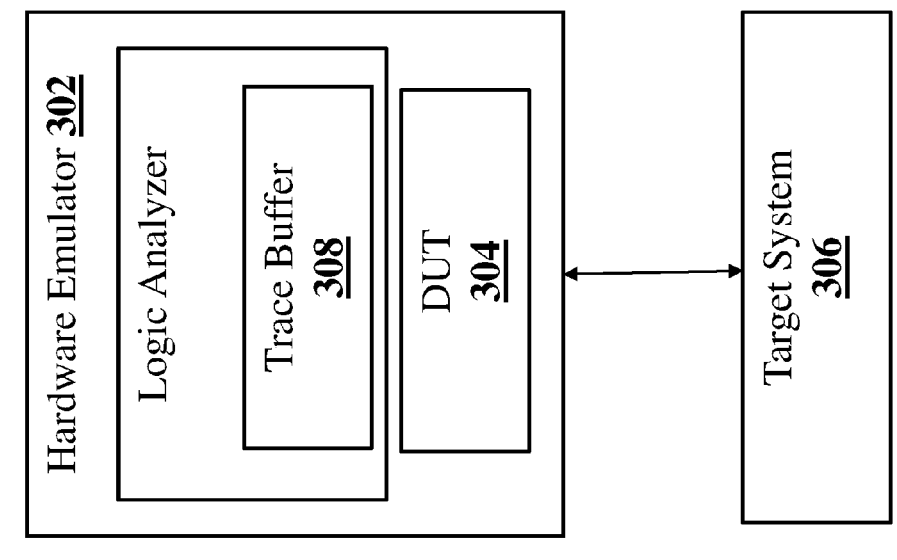
FIG. 3 is a block diagram of an emulation system, according to an exemplary embodiment.

FIG. 3 illustrates a block diagram of an emulation system 300. The logic analyzer system of the FIG. 2 can be embedded into a hardware emulator of an emulation system described in FIG. 3. It should be appreciated that the logic analyzer system of the present disclosure can be a stand-alone instrument or used in instruments other than emulation systems without departing from the scope of the disclosed embodiments.

The emulation system 300 includes a hardware emulator 302 that is a programmable device used in the verification of a logic design. The hardware emulator 302 may include any type of acceleration or emulation platform. The hardware emulator 302 is configured with a design under test (DUT) 304 and emulates the functionality of a design and allows a circuit designer to observe how the design operates in a target system 306 without having to first physically fabricate the hardware. The hardware emulator 302 may comprise a computer for providing emulation support facilities, that is, emulation software, a compiler, and a graphical user interface to allow the circuit designer to program the hardware emulator 302.

The target system 306 is an operating environment, or another electronic device, where the DUT 304, once manufactured, will be installed, or will be connected to. In an embodiment, the target system 306 for a microprocessor DUT may be a personal computer. The target system 306 may also include memory, microprocessors, application specific integrated circuits (ASIC), field programmable gate arrays (FPGAs), and any number of similar circuitry components, which may communicate with one another to perform specific functions.

The circuit designer emulates the DUT 304 by running the hardware emulator 302. The DUT 304 may have flaws or bugs that should be fixed before they can be implemented in the target system 306. During emulation, a trace buffer 308 that is partitioned into a plurality of segments may be used as an aid in analyzing and debugging the DUT 304 under development. The trace buffer 308 stores a record of changing states of signal inputs, signal outputs and internal signals of the DUT 304 being emulated. The states may be stored once per clock cycle. It shall be appreciated that the states may not be stored based on clock cycle and may be stored based on one or more rules defined by the circuit designer without departing from the scope of the disclosed embodiments.

The use of the trace buffer 308 allows the circuit designer to emulate the DUT 304 under development and operate the DUT 304 up to a point where an error condition may occur. The trace buffer 308 may continue to collect signal states but at some point tracing may be stopped to allow the circuit designer to examine the record of signal states to determine what events caused the error. Alternatively, the operation of the DUT 304 may be permitted to continue past the error condition so that the circuit designer has a record of events that occur after the error condition. In this way, the record of signal states provided by the trace buffer 308 aids the circuit designer in developing a target electronic circuit. In the illustrated embodiment, the hardware emulator 302 includes the trace buffer 308, however it should be appreciated that the trace buffer 308 may be external to the hardware emulator 304, and some emulation systems may not include the trace buffer 308 as an integral component without departing from the scope of the disclosed embodiments.

Referring back to FIG. 2, a DUT 202 may be any system that includes logic design that needs to be verified, such as a single integrated chip, a printed circuit board with multiple chips, or multiple printed circuit boards each having multiple chips. In one embodiment, the hardware emulator mimics the functionality of the DUT 202 that is being developed. The hardware emulator is a programmable device used in the verification of the DUT 202. The hardware emulator allows designers to test and verify the operation of the DUT 202 without having to first physically fabricate the DUT 202. The hardware emulator may comprise a computer for providing emulation support facilities, such as emulation software, a compiler, and a graphical user interface that allow the circuit designer to program the hardware emulator. Also, circuitry may be employed within the hardware emulator that may be used to emulate the DUT 202. In addition to the DUT 202, the circuitry may also be used to implement a test bench and any other instrumentation circuitry that might be added during design compilation to aid the run time system.

The DUT 202 may also be connected to an external target system containing a dynamic electronic circuits such as dynamic RAM or analog circuits. The dynamic electronic circuits are electronic circuits that can retain memorized values for a relatively short duration of time. Without circuitry that may refresh memory locations or without a sufficiently fast clock signal, the dynamic electronic circuits' memory values may be lost. Dynamic electronic circuits generally cannot be stopped without losing their respective states. Consequently, the circuits generally cannot resume execution from the same state after the clock is restarted. In other words, the dynamic electronic circuits are generally not capable of being stopped or halted with respect to a system or circuit clock, because their respective states will be lost and will generally be unrecoverable.

In the illustrated embodiment, the logic analyzer system is programmable to select a plurality of data signals to be sampled and probe selected data signals from the DUT 202. The selected data signals may be outputs from processors in a processor based emulation systems or output from configurable logic blocks in a programmable logic based emulation systems. The probed data signals are sent to the trace buffer 210 during the emulation. The data signals may be written into the trace buffer 210 using it as a circular buffer. In each clock cycle, one data sample of the data signals may be written into the trace buffer 210 at a given trace address generated by an address counter. The address counter includes one or more counter circuits and further includes the segment counter 208 and the intra segment address counter 212. Both the segment counter 208 and the intra segment address counter 212 are set to zero before the transfer of the data signals from the electronic circuit to the trace buffer 210.

The trace buffer 210 can be random access memory (RAM) configured as the circular buffer. In one embodiment, with segmentation, different portions of the trace buffer 210 can be partitioned and/or designated as segments having same or different properties. The different segments of the trace buffer 210 may only be made accessible by the emulation system in such a way that the segment counter 208 drives higher address bits of the segments of the trace buffer 210 and the intra-segment address counter 212 drives lower address bits of the segments of the trace buffer 210. In an alternate embodiment, a plurality of separate memory units may be utilized such that each of the memory unit is configured to operate as a segment of the trace buffer 210 of the present disclosure without departing from the scope of the disclosed embodiments.

In one embodiment, in order for the hardware emulator to segment the trace buffer 210, the segments of the trace buffer 210 may be assigned physical addresses beginning at some offset from the start of a main memory and continuing for some predetermined length. A memory address for information stored in a segment of the trace buffer 210 may include another offset from the beginning of the particular segment of the trace buffer 210 to the position at which the addressed information is stored.

In one embodiment, the segmentation of the trace buffer 210 may require that logical addresses be translated into physical addresses assigned by a memory controller of the emulation system implementing the segmented trace buffer 210. The segmentation may require the memory controller to keep track of where each segment of the trace buffer 210 began and the length of the segment of the trace buffer 210 in order to enable such a translation. The memory controller and/or the intra segment address counter 212 may utilize a series of descriptors stored in tables, a global descriptor table and one or more local descriptor tables. Each such descriptor table is itself a segment with a beginning address, a length, and properties. The descriptors in each table indicate where the related segment begins in memory, its length, and its properties. A descriptor is accessed and stored in one of a limited number of register files 216 so that the segment information is available for use by a processor of the external computer 214 for address translation. The memory controller is further configured to control the operation of the segment counter 208 and/or the intra segment address counter 212.

The trigger module 206 is configured to generate a trigger signal. In one embodiment, the trigger module may include a netlist circuit that represents a circuit within the hardware emulator that is used for netlists. The netlist may represent any type of logic or memory elements, such as combinational gates and state devices and is used to define a trigger condition. The netlists can be loaded into the trigger module 206 by a compiler module. The compiler module is configured to receive and compile the netlist (also referred as a netlist design file) containing the logical gate design of the DUT 202, and then to generate a virtual logic file based on the compiled netlist. The compiler module maps the DUT 202 logic and timing of operations into the hardware components of the hardware emulator to generate instructions for the components of the hardware emulator to cause the hardware emulator to function as the DUT would function. The compiler module may further include a partitioner and scheduler component, though it should be appreciated that the compiler may be segmented into any number of component software modules. The partitioner may determine which part of the netlist is going to be executed by which type of hardware resource of the hardware emulator. Then, a scheduler may determine for that part of the netlist which of the hardware resources should execute the part of the netlist and when in the execution lifecycle the netlist should be executed. The compiler may be capable of determining the status of components of the hardware emulator, including the allocation status or whether the netlist is broken.

In one embodiment, a topology of the circuitry represented by the netlist may be dynamic, so that it can be modified during run time. In an alternate embodiment, the topology of the circuitry represented by the netlist may be fixed, so it cannot be modified during run time. In one embodiment, the netlist of the trigger module 206 loaded into the hardware emulator may be used to generate trigger signals during run time. The run time refers to the time when the DUT 202 is loaded into the hardware emulator and the circuit designer can interact with the hardware emulator whether the DUT 202 is presently being emulated or not. The netlist of the trigger module 206 may receive the selected data signals from the DUT 202. The selected data signals are signals that may be used in the definition of a trigger condition by the trigger module 206.

The outputs of the netlist may further be provided to a trigger detection circuit of the trigger module 206. The trigger detection circuit represents the circuitry within the trigger module 206 that is used in conjunction with the netlist to generate trigger signal. The trigger detection circuit may have a fixed topology, so it cannot be modified during the emulation session, although it may include lookup tables inside it that can be re-programmed during the emulation session. The trigger detection circuit may also have a flexible topology, so it can be modified during the emulation session. The trigger detection circuit may be implemented using emulation resources or it can be a separate piece of hardware that is hardwired. In one embodiment, the trigger detection circuit within the trigger module 206 may solely be responsible to generate trigger signal. In an alternate embodiment, the netlist and the trigger detection circuit together form a trigger mechanism to generate the trigger signal.

The trigger detection circuit is programmed to generate the trigger signal when the circuit designer defined trigger condition has been met. The trigger condition may be defined by the circuit designer based on an event or series of events that occur during emulation of the DUT 202. In one embodiment, the trigger condition may be defined based on the values of a predetermined set of data signals in the DUT 202. For example, if A, B, and C, are data signals in the DUT 202, a trigger could be defined simply as follows: A=1 & B=0 & C=1. In this case, when the values of these three data signals match their expected values of 1, 0, and 1, respectively, the trigger detection circuit would produce the trigger signal indicating that the trigger condition has been met. A simple comparator circuit could be used to produce this trigger signal. In alternate embodiments, the triggers may also be based on much more complex combinations of the data signals within the DUT 202. Using the more complex trigger detection circuit, a different set of conditions can be tested each cycle, and based on the result, the trigger detection circuit decides whether to issue the trigger signal or not. In the embodiments discussed above, a state machine may be used in the trigger detection circuit. Irrespective of the flexibility or complexity of the trigger detection circuit being utilized in the above discussed embodiments, the trigger condition can be based on signal data values that are accessible from within the hardware emulator. Such signal data values may be any data signal that is accessible from inside the hardware emulator, whether generated within the DUT 202, a test bench embedded inside the hardware emulator, or input from an external test bench or a target system. It shall be appreciated by a person having ordinary skill in the art that the present disclosure is not limited to the trigger detection circuit discussed above, and the circuit designer may define any trigger condition based on an event or series of events that occur during emulation of the DUT 202 without departing from the scope of the disclosed embodiments.

The circuit designer may specify the trigger condition definition via a text file or a graphical user interface. The trigger condition definition is then compiled by a host workstation of the emulation system into a downloadable image. In one embodiment, the image may be loaded into lookup tables in the trigger detection circuit of the trigger module 206. In another embodiment, the image may be a compiled image that is programmed into the netlist of the trigger module 206. In yet another embodiment, part of this image is loaded into lookup tables in the trigger detection circuit of the trigger module 206, and part of it is a set of compiled images that are programmed into the netlist of the trigger module 206. The circuit design may run the hardware emulator until the trigger condition definition is met and the trigger signal is generated.

In operation, the trace buffer 210 comprises a plurality of segments. The plurality of segments includes at least a first segment and a last segment. A segment of the plurality of segments of the trace buffer 210 is configured to continually collect and store data signals of the dynamic electronic circuit of the DUT 202. In an embodiment, the data signals are collected in a current segment (for example, the first segment) of the plurality of segments. The trigger signal generated by the trigger detection circuit of the trigger module 206 when the trigger condition is met, may be used to freeze the capture of the data signals in the current segment (for example, the first segment) of the plurality of segments of the trace buffer 210. At this stage, subsequent data signals are transmitted into a new segment (for example, a second segment) of the plurality of segments of the trace buffer 210. As a result, each time the trigger signal is generated, the collection of the data signals is stopped in the current segment and subsequent data signals are collected in the new segment. In one embodiment, the new segment will be a subsequent segment of the plurality of segments.

In an embodiment, when the trigger signal is generated, the segment counter 208 is incremented by one such that the next data signals captured will be transferred into next segment of the plurality of segments of the trace buffer 210. For example, the current data samples are being transferred to the first segment of the plurality of segments of the trace buffer 210. At this moment, the trigger signal is generated. Upon the generation of the trigger signal, the data transfer in the first segment of the plurality of segments of the trace buffer 210 is stopped and the segment counter 208 is incremented by one. This results in the next set of data samples being transferred to a next segment (for example, a second segment) of the plurality of segments of the trace buffer 210. This process continues and each time the new trigger signal is generated, the data sample transfer stops at the current segment of the plurality of segments of the trace buffer 210 and moves to the new segment of the plurality of segments of the trace buffer 210. When the transfer of the data signals reaches the last segment of the plurality of segments of the trace buffer 210 and a next trigger signal is generated when the next trigger condition is met, the data transfer stops at the last segment of the plurality of segments of the trace buffer 210 and new data signals will again be transferred back to the first segment of the plurality of segments of the trace buffer 210.

The termination module 204 comprises a termination detection circuit adapted to provide a termination signal when a termination condition is met. The termination condition may be defined by the circuit designer based on an event or series of events that occur during emulation of the DUT 202. In one embodiment, the termination condition may be defined based on the values of a predetermined set of data signals in the DUT 202. For example, if A, B, and C, are data signals in the DUT 202, the termination condition could be defined simply as follows: A=0 & B=1 & C=0. In this case, when the values of these three data signals match their expected values of 0, 1, and 0, respectively, the termination detection circuit would produce the termination signal indicating that the termination condition has been met. A simple comparator circuit could be used to produce this termination signal. In alternate embodiments, the termination signals may also be based on much more complex combinations of the data signals within the DUT 202. Using the more complex termination detection circuit, a different set of conditions can be tested each cycle, and based on the result the termination detection circuit decides whether to issue the termination signal or not.

In the embodiments discussed above, a state machine may be used in the termination detection circuit. Irrespective of the flexibility or complexity of the termination detection circuit being utilized in the above discussed embodiments, the termination condition is based on signal data values that are accessible from within the hardware emulator. Such signal data values may be any data signal that is accessible from inside the hardware emulator, whether generated within the DUT 202, a test bench embedded inside the hardware emulator, or input from a target system. It shall be appreciated by a person having ordinary skill in the art that the present disclosure is not limited to the termination detection circuit discussed above, and the circuit designer may define any termination condition based on an event or series of events that occur during emulation of the DUT 202 without departing from the scope of the disclosed embodiments. In operation, when the termination signal is generated by the termination detection circuit of the termination module 204, the transfer of the data signals of the DUT 202 in any of the plurality of segments of the trace buffer 210 is stopped. The termination signal may also be requested manually by the user.

The register file 216 may be configured to store old and new addresses generated by the intra segment address counter 212 each time the data signals are transferred from the DUT 202 to the any of the plurality of segments of the trace buffer 210. Also, the external computer 214 may be configured to receive contents stored in the register file 216 to determine where the data signals for each segment of the plurality of segments of the trace buffer 210 starts and ends.

Figure 4A:
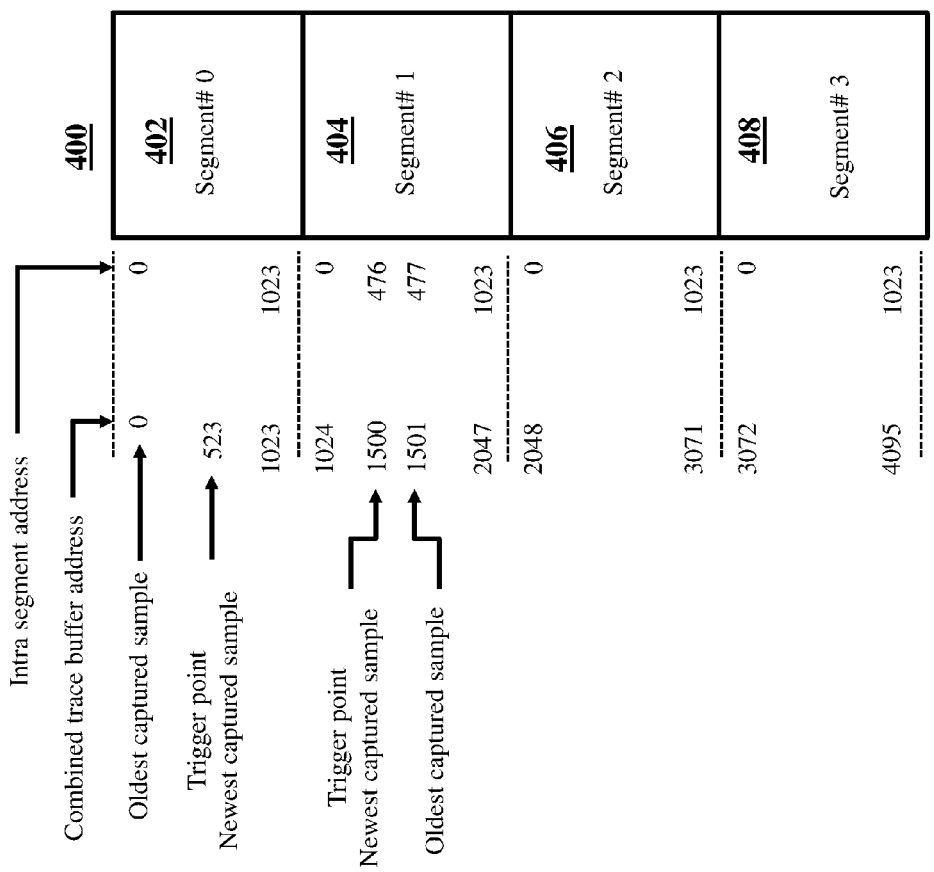
FIG. 4A is a diagram showing the contents of a trace buffer of a logic analyzer system, according to an exemplary embodiment.

FIG. 4A illustrates a diagram showing the contents of a trace buffer 400 of a logic analyzer system, according to an exemplary embodiment. The trace buffer 400 has a total capacity of 4096 addresses and is partitioned into four segments each of 1024 addresses, namely, segment #0 402, segment #1 404, segment #2 406, and segment #3 408. The data samples captured from a device under test (DUT) is written into the segment #0 402, the segment #1 404, the segment #2 406, and the segment #3 408 of the trace buffer 400.

During operation, in each clock cycle, the data samples captured from the DUT are first written into the segment #0 402 of the trace buffer 106 at a trace address generated by an intra-segment address counter. A trigger detection circuit detects a trigger pattern from the received data signals, and is programmable to generate a trigger signal when a trigger condition is met. In the illustrated example, assuming that the trigger condition is satisfied at intra segment trace address 523 of the segment #0 402, then the trigger detection circuit generates the trigger signal. Upon the generation of the trigger signal, the trigger signal is transmitted to a segment counter which causes the segment counter to stop counting and increment a segment number by one to the segment #1 404. At this point, the capturing the data samples into the segment #0 402 of the trace buffer 400 is stopped. The data samples in the segment #0 402 of the trace buffer 400 is having the oldest captured data samples at intra segment trace address 0 and the newest captured data sample at intra segment trace address 523. The new set of data samples now captured will be transferred to the segment #1 404. This process continues and each time the new trigger signal is generated, the data sample transfer stops at a current segment of any of the segment #0 402, the segment #1 404, the segment #2 406, and the segment #3 408 of the trace buffer 400 and moves to a next segment of the current segment of the trace buffer 400. When the transfer of the data signals reaches to the segment #3 408 of the trace buffer 400, and a next trigger signal is generated when the next trigger condition is met, the data transfer stops at the segment #3 408 of the trace buffer 400 and new data signals will again be transferred back to the segment #1 402 of the trace buffer 400.

Figure 4B:
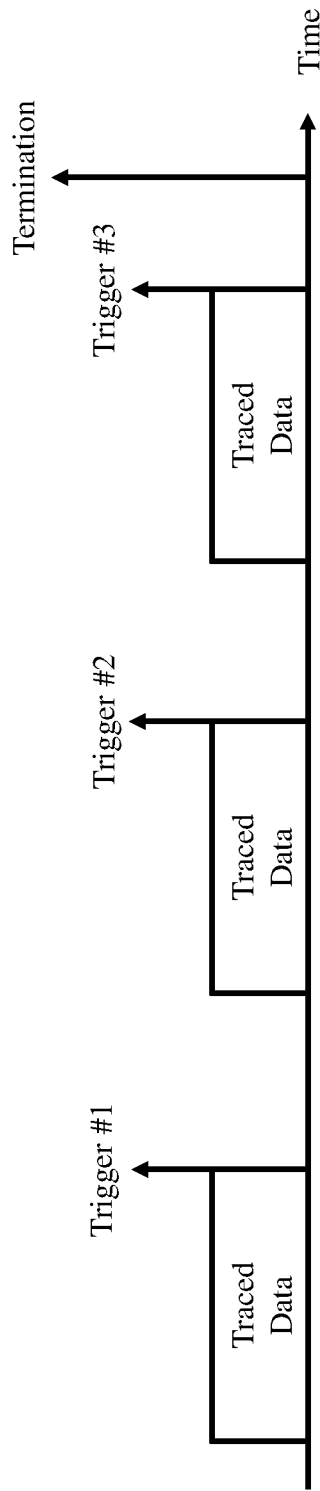
FIG. 4B illustrates a graph depicting that a trace buffer of a logic analyzer system can record history of data signals occurring before multiple trigger points, according to an exemplary embodiment.

Thus, the segment #0 402, the segment #1 404, the segment #2 406, and the segment #3 408 of the trace buffer 400 of the logic analyzer of the emulation system is able to record history of the data signals that occurred before the multiple trigger point as depicted in FIG. 4B. The traced data up to trigger #1 is stored in the segment #0 402 of the trace buffer 400 and the trace data up to trigger #2 is stored in the segment #1 404 of the trace buffer 400, and so on.

FIG. 5 illustrates a flow diagram depicting a method of tracing an operation of a circuit by a logic analyzer system in an emulation system, according to an exemplary embodiment. At step 502, the logic analyzer system captures data signals from an electronic circuit. In an embodiment, the electronic circuit may be a dynamic electronic circuit containing dynamic components such as dynamic RAM or an analog circuit. The dynamic electronic circuit is an electronic circuit that can retain memorized values for a relatively short duration of time. The dynamic electronic circuit generally cannot be stopped because they lose their state and subsequently cannot resume execution from the same state after the clock is restarted. In other words, the dynamic electronic circuit is generally not clock-stoppable.

In an embodiment, an analog circuit is an example of the dynamic circuit. However, the analog circuit, while dynamic, is not digital, and does not have a clock signal. The analog circuit may be embedded inside a target system that has a digital interface. Embedding the dynamic circuit inside a digital circuit will typically make the digital circuit also dynamic, therefore embedding the analog circuit inside the target system may cause the target system to be dynamic.

In the illustrated embodiment, the electronic circuit is a logic design that is being partially mapped into a hardware emulator of an emulation system to provide a design under test (DUT). The hardware emulator may include any number of processors capable of performing the various tasks and processes for emulating the electronic circuit or other logical processing circuitry, multiplexers configured to direct data signals to and from the processors, buses for communicating data between the processors, and data lanes connecting the components of a processor. The hardware emulator may be designed to mimic the functionality of the electronic circuit design, based on programmable logic that configures the behavior of the emulator chips to mimic the particular electronic circuit.

In an embodiment, the logic analyzer is programmable to capture a plurality of data signals to be sampled and selected data signals from the electronic circuit are probed. At step 504, the probed/captured data signals are sent to a first segment of a trace buffer during the emulation. The data signals are written into the trace buffer using it as a circular buffer. In each clock cycle, one data sample of the data signals may be written into the trace buffer at a given trace address generated by an address counter. The address counter includes one or more counter circuits, and further includes a segment counter and an intra-segment address counter. Both the segment counter and the intra segment address counter are set to zero before the transfer of the data signals from the electronic circuit to the first segment of the trace buffer.

In the illustrated embodiment, the trace buffer is partitioned into a plurality of segments. The trace buffer can be a random access memory (RAM) configured as the circular buffer. It will be appreciated by those of ordinary skill in the art that other suitable circuitry such as a sequential access memory can be used to implement the trace buffer.

At step 506, a trigger module is configured to generate the trigger signal. The trigger module may include a trigger detection circuit and optionally a netlist. The trigger detection circuit may be implemented using emulation resources or it can be a separate piece of hardware that is hardwired. In one embodiment, the trigger detection circuit within the trigger module may solely be responsible to generate trigger signal. In an alternate embodiment, the netlist and the trigger detection circuit together form a trigger mechanism to generate the trigger signal. A trigger condition may be defined by the circuit designer based on an event or series of events that occur during emulation of the electronic circuit.

At step 508, the trigger signal is generated by the trigger detection circuit of the trigger module when the trigger condition is met. The generation of the trigger signal may be used to stop the capture of the data signals in the first segment of a plurality of segments of the trace buffer. At this stage, subsequent data signals are transmitted into a new segment (second segment) of the plurality of segments of the trace buffer as recited in step 510. Now, each time upon generation of the trigger signal when the trigger condition is met, the collection of the data signals is stopped in the current segment and subsequent data signals are collected in the new segment of the plurality of segments of the trace buffer.

At step 512, a termination module includes a termination detection circuit adapted to provide the termination signal when a termination condition is met. The termination condition may be defined by the circuit designer based on an event or series of events that occur during emulation of the electronic circuit. In operation, when the termination signal is generated by the termination detection circuit of the termination module, the transfer of the data signals of electronic circuit in any of the plurality of segments of the trace buffer is stopped as recited by step 514.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc., are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A system for tracing operations of electronic circuits, the system comprising:
   an electronic circuit design being emulated;
   a trace buffer comprising a plurality of segments configured to continually collect and store data signals produced by the electronic circuit design, wherein the data signals are collected in a first segment of the plurality of segments;
   an address counter comprising a segment counter and an intra segment address counter, wherein the data signals are transferred to an intra segment address generated by the address counter in the first segment, wherein both the segment counter and the intra segment address counter are set to zero before the transfer of the data signals from the electronic circuit to the first segment; and
   a trigger detection circuit configured to determine that a trigger condition is met based upon an output received from the electronic circuit design associated with the occurrence of one or more events during emulation of a netlist of the electronic circuit design and further configured to provide a trigger signal to the trace buffer when the trigger condition is met,
   wherein, upon receiving the trigger signal, the trace buffer is configured to collect the data signals from the electronic circuit design in a second segment of the plurality of segments, and wherein upon receiving each additional trigger signal, the trace buffer is configured to collect the data signals from the electronic circuit design in a next segment of the plurality of segments.

2. The system of claim 1, wherein the electronic circuit design comprises a clock that continues to a next cycle independent of providing the data signals to the trace buffer.

3. The system of claim 2, further comprising a dynamic electronic circuit design.

4. The system of claim 3, wherein the trace buffer is coupled to the dynamic electronic circuit design, and wherein the trace buffer stores a record of changing states of signal inputs, signal outputs and internal signals of the dynamic electronic circuit design at a clock cycle.

5. The system of claim 1, further comprising a termination detection circuit configured to provide a termination signal when a termination condition is met, wherein a transfer of the data signals of the electronic circuit design in any of the plurality of segments of the trace buffer is stopped upon generation of the termination signal.

6. The system of claim 1, wherein the plurality of segments comprises at least the first segment and a last segment, and wherein each of the plurality of segments of the trace buffer is assigned a physical address beginning at some offset from a start of a main memory and continuing for some predetermined length.

7. The system of claim 6, wherein after the transfer of the data signals to the last segment of the trace buffer, a next trigger signal generated when a next trigger condition is met moves the transfer of the data signals back to the first segment of the plurality of segments of the trace buffer.

8. The system of claim 1, wherein the intra segment address counter is incremented by one each time the data signals are received from the electronic circuit design to be transferred to the plurality of segments of the trace buffer.

9. The system of claim 1, further comprising a register file configured to store old and new addresses generated by the intra segment address counter each time the data signals are transferred from the electronic circuit design to any of the plurality of segments of the trace buffer.

10. The system of claim 9, further comprising an external computer configured to receive contents stored in the register file to determine where the data signals for each segment of the plurality of segments of the trace buffer starts and ends.

11. An emulation system comprising:
    a hardware emulator configured to emulate a design under test, wherein the design under test comprises an electronic circuit design being emulated;
    a trace buffer of a logic analyzer comprising a plurality of segments configured to continually collect and store data signals of the design under test, wherein the data signals are collected in a current segment of the plurality of segments;
    an address counter comprising a segment counter and an intra segment address counter, wherein the data signals are transferred to an intra segment address generated by the address counter in the current segment, wherein the intra segment address counter is set to zero before the transfer of the data signals from the electronic circuit to the current segment; and
    a trigger detection circuit of the logic analyzer configured to determine that a trigger condition is met based upon an output received from the electronic circuit design associated with the occurrence of one or more events during emulation of a netlist of the electronic circuit design and to provide a trigger signal to the trace buffer when the trigger condition is met, wherein each time upon generation of the trigger signal when the trigger condition is met the collection of the data signals is stopped in the current segment and subsequent data signals are collected in a new segment of the plurality of segments.

12. The emulation system of claim 11, further comprising a termination detection circuit adapted to provide a termination signal when a termination condition is met, wherein a transfer of the data signals of the dynamic electronic circuit design in any of the plurality of segments of the trace buffer is stopped upon generation of the termination signal.

13. The emulation system of claim 11, wherein each of the plurality of segments of the trace buffer are of different size.

\* \* \* \* \*